United States Patent [19]

Jonas, Jr.

[11] Patent Number: 5,481,581
[45] Date of Patent: Jan. 2, 1996

[54] PROGRAMMABLE BINARY/INTERLEAVE SEQUENCE COUNTER

[75] Inventor: Oscar F. Jonas, Jr., Colorado Springs, Colo.

[73] Assignees: United Memories, Inc., Colorado Springs, Colo.; Nippon Steel Semiconductor Corp., Chiba, Japan

[21] Appl. No.: 445,058

[22] Filed: May 19, 1995

[51] Int. Cl.⁶ ................................................. H03K 21/02
[52] U.S. Cl. ............................................. 377/55; 377/33
[58] Field of Search ......................................... 377/55, 33

[56] References Cited

U.S. PATENT DOCUMENTS

| | | | |
|---|---|---|---|
| 4,287,577 | 9/1981 | Deal | 365/233 |
| 4,979,194 | 12/1990 | Kawano | 377/55 |
| 5,062,128 | 10/1991 | Katsuragi et al. | 377/55 |
| 5,386,537 | 1/1995 | Asano | 395/425 |

*Primary Examiner*—John S. Heyman
*Attorney, Agent, or Firm*—Edward D. Manzo; Mark J. Murphy; John J. King

[57] ABSTRACT

A counter circuit selectively generates counting sequences in binary and interleave counting modes. A counter is formed by 3 toggle flip-flops. The toggle signals are provided by a toggle control circuit which contains logic gates that are enabled or disabled based on the state of a mode select signal. In binary mode, output bits are permitted to be used to toggle higher order count stages. In interleave mode, the binary toggle signals are blocked, and another counter circuit counts toggle signals in the interleave sequence, which signals are passed by the toggle control circuit to toggle inputs of the main counter. The other counter circuit can be reset in response to a reset signal applied to a load enable input.

21 Claims, 4 Drawing Sheets

PROGRAMMABLE BINARY/INTERLEAVE SEQUENCE COUNTER

TECHNICAL FIELD

This invention is directed to semiconductor memories and counter circuits and in particular to sequential address generation for memory devices.

BACKGROUND OF THE INVENTION

Semiconductor memories are used to store information, often in conjunction with microprocessors or other control circuits. Typical memory devices are comprised of an array of memory cells together with various "peripheral" circuitry. Each memory cell is capable of storing usually just one piece of data typically in binary format, a logic "1" or "0." The memory cells are arranged in a grid or array of rows and columns. The array may have multiple components, i.e, subarrays, each of which has rows and columns. In either case, each row of memory cells corresponds to and is accessible by a word line, and each column of memory cells corresponds to and is accessible by bit lines, often a pair of bit lines. At or near each intersection of each row and pair of bit lines in the array is a respective memory cell. In order to write or read from a specific memory cell, the memory device must be told which cell(s) to access. This is done by reading an address and decoding it into a row address and a column address. Data stored in the memory cell may then be transferred to the dam lines for outputting by the semiconductor memory, or dam may be written into that addressed cell via the bit lines. Traditional memories often require that for each memory cell that is externally accessed, an address must initially be loaded. Hence, a string of multiple memory accesses could require multiple address loads equal to the number of accesses.

While this method of addressing is adequate for random memory access of individual memory cells, often memory accesses occur in streams or blocks of binary sequential memory cells. In response, synchronous or burst mode semiconductor memories have been developed. After a memory read or write, these memory devices will automatically increment sequentially the address of the memory cell being accessed. Such incrementing is done by implementing addresses in a sequence, using a counter to supply increments. The counter counts in a traditional sequence, i.e., 1,2,3,4,5, etc. (except the count is in binary rather than decimal form). "Binary sequential mode" refers to counting in a traditional sequence with the numbers represented in a binary format. An address circuit which automatically increments the address after each memory access allows a whole block of sequential data to be accessed without having to load a new address for each memory cell read or written. This significantly improves memory access speeds for blocks of sequential memory cells, because the number of address loads is greatly reduced. The automatic address incrementing is typically achieved by the use of a counter. This counter is distinguishable from counters in DRAM memory devices which increment for the purpose of automatic refresh.

Dynamic Random Access Memories (DRAMs) due to their nature are made up of memory cells that generally use charge stored in capacitors as the physical storage mechanism. The charge stored in such capacitors leaks away. This requires the memory cells to be refreshed, which generally is done at a periodic rate. This rate needs to be fast enough that each memory cell will be refreshed before the charge, representing data, stored in each memory cell capacitor leaks away. Entire rows of memory cells can be refreshed at the same time. By activating a row during a memory refresh cycle, all of the memory cells along the row will refresh the charge stored therein.

Early implementations of DRAMs required external refresh control. Many newer designs now incorporate this function into the memory device itself.

However, the counters for performing the automatic refresh function cycle through the memory array sequentially row by row, as opposed to memory cell by memory cell. Automatic refresh counters typically count in a binary sequential fashion only. Automatic refresh counters that are used for self-refresh purposes do not have to operate at high speeds since these counters are incremented at slow refresh rates.

Another common sequential memory access, made popular by some implementations of cache memories, is called an "interleave sequence" (sometimes referred to in the computer industry as an "Intel sequence"), where memory access is optimized by the use of an interleave pattern.

Cache memories are used to store copies of main memory data and are constituted by blocks of data called "pages." Caches circuits are often comprised of faster and consequently more expensive memory devices. Commonly accessed blocks of data are replicated in the cache to allow faster memory access in the areas of memory where access is most frequently occurring. The area in which memory accesses occur most frequently is not static, but changes. As it changes, the cache circuit will update itself by loading new blocks of memory or pages so it will always try to contain the areas where memory access is most common. Because of this, large blocks of data are frequently transferred between the cache memory and the main memory. Due to the nature of caches being arranged in blocks of data called pages, an Intel or interleave sequence has been developed to improve the efficiency of loading the processor's on-chip first level cache. Additionally, it allows a processor to load a cache beginning with an initial memory address in the middle of a page not currently loaded in the cache. The interleave sequence will guarantee that the rest of the page will be loaded into the cache in its entirety. Therefore, it is beneficial when memory address circuits contained counter circuits capable of counting in interleave sequential mode, for such events as cache loading (when the processor is involved) and in binary mode, for such events as reading a disk (when the processor is usually not involved).

In order to help illustrate how a counter circuit is incorporated into a memory device for generating sequential addresses, reference is made to a prior art circuit 140 of FIG. 1. Circuit 140 includes a memory cell array 142 which receives inputs from row decoders 144, column decoders 146 and input buffers 148. Array 142, cooperating with sense amplifiers (not separately shown) generates outputs to output buffers 150. Input buffers 148 and output buffers are used for data which is to be retrieved from or stored in the array. Decoders 144 and are used to select a unique row and column. Each combination of row and column will address a unique memory cell within the array. Address decoders 144 and 146 receive address lines from the address latch 152. The address latch can be directly loaded from the input buffers or from a counter 144. Counter circuit 154 receives a starting count value from input buffers 148. As a result, a counter circuit such as counter 154 can be used to generate addresses for a memory circuit. Current synchronous or burst mode DRAMs are similarly configured.

TABLE 1

BINARY/INTERLEAVE ADDRESSING SEQUENCE

| START ADDRESS | Sequential Addressing | Interleave Addressing |
|---|---|---|
| BURST LENGTH OF TWO | | |
| 0 | 0,1 | 0,1 |
| 1 | 1,0 | 1,0 |
| BURST LENGTH OF FOUR | | |
| 00 | 0,1,2,3 | 0,1,2,3 |
| 01 | 1,2,3,0 | 1,0,3,2 |
| 10 | 2,3,0,1 | 2,3,0,1 |
| 11 | 3,0,1,2 | 3,2,1,0 |
| BURST LENGTH OF EIGHT | | |
| 000 | 0,1,2,3,4,5,6,7 | 0,1,2,3,4,5,6,7 |
| 001 | 1,2,3,4,5,6,7,0 | 1,0,3,2,5,4,7,6 |
| 010 | 2,3,4,5,6,7,0,1 | 2,3,0,1,6,7,4,5 |
| 011 | 3,4,5,6,7,0,1,2 | 3,2,1,0,7,6,5,4 |
| 100 | 4,5,6,7,0,1,2,3 | 4,5,6,7,0,1,2,3 |
| 101 | 5,6,7,0,1,2,3,4 | 5,4,7,6,1,0,3,2 |
| 110 | 6,7,0,1,2,3,4,5 | 6,7,4,5,2,3,0,1 |
| 111 | 7,0,1,2,3,4,5,6 | 7,6,5,4,3,2,1,0 |

Table 1 shown here provides a chart for 1 bit, 2 bit, and 3 bit sequential count sequences for both binary and interleave modes. While binary mode counting progresses in a traditional counting sequence, interleave mode counting may vary significantly, depending on the starting count value. In interleave mode, the first bit (least significant bit), will toggle every count increment. The second bit will toggle on every second count increment, i.e., on the second, fourth, sixth, eighth, etc., count increments. The third bit will toggle on every fourth count increment, i.e., or on the fourth, eighth, twelfth, etc., count increments. The (n)th bit will toggle on every $(2^{N-1})$th count increment.

With industry pushing for higher performance systems and as memory access becomes more of a bottleneck with ever increasing microprocessor speeds, increased memory access speeds are becoming more important.

It is therefore an object of the present invention to provide a counter circuit to be used in conjunction with address lines to automatically increment the address in both a binary and an interleave sequence in order to increase access speeds for blocks of sequential dam in semiconductor memories.

Another object of the invention is to allow real time switching between the two modes of sequential block memory access. This will allow for even greater addressing flexibility.

SUMMARY OF THE INVENTION

One structural feature or aspect of the present invention is an interleave/binary count circuit to be used in semiconductor memories for generating address sequences for block data accesses. Preferably, the counter includes a counter circuit capable of counting in either binary mode or counting in interleave mode, with a toggle control circuit capable of choosing the appropriate count sequence for the next required address, which can be used for high speed block memory accesses, for example. Accordingly, the circuit can provide for multiple memory reads or writes without continually loading new addresses. It also allows the mode of access to change without loading a new address in the event that the address last used for the previous mode is the starting address for the new mode. The present invention is capable of counter speeds in excess of 100 MHz.

According to method aspects of the present invention, a count sequence is generated by selecting between sequential count modes, binary or interleave. A next count is continually generated and outputted it for the desired sequence length. The method also allows for generating a count sequence in a new mode, starting with the count value last generated in the previous mode.

More specifically, a counter is provided by a number of counting stages, which in the preferred embodiment are flip-flops, and preferably T-flip-flops. The flip-flops provide the count bits for a count bus. Toggle signals applied to the higher order flip-flops are selectable. That is, a selection signal is used to indicate to the circuit whether counting is to proceed in the interleave sequence or the binary sequence. The logic state of the selection signal, which is applied to a toggle control circuit, determines which signals will be applied to toggle the higher order flip-flops. In the binary mode, the toggle signals are based on the lower order flip-flop output signal, and signals that would be used in the interleave mode are blocked. Conversely, in the interleave mode, toggle signals are generated by further circuitry, and the lower order flip-flop output signals are blocked from toggling the higher order flip-flop(s).

The toggle signals generated for the interleave mode are provided by interleave state control circuitry which preferably include a plurality of further flip-flops. In the preferred embodiment, this includes two further T-flip-flops. These preferably count in binary fashion and, together with suitable logic circuitry, provide two toggle signals for the two higher order counter flip-flops. In particular, a first flip-flop of the interleave state control circuit provides an output that is selectively blocked or passed by logic in the toggle control circuit to provide a first interleave toggle control signal to a toggle input of the second lowest order counting stage. A second flip-flop of the interleave state control circuit is toggled based on an output of the by first flip-flop, and provides an output on which an AND function is performed with an output of the first flip-flop to produce a resulting signal in accordance with the manner in which interleave counting is arranged. The resulting signal is selectively blocked or passed by logic circuits in the toggle control circuit to provide the second interleave toggle control signal to toggle the third lowest count stage (which in the preferred embodiment is the highest order counting stage of counter 16).

The interleave state control circuitry preferably is responsively connected to an interleave reset signal which is used to reset the data content of the interleave flip-flops to zero (low) states in the preferred embodiment.

BRIEF DESCRIPTION OF THE DRAWINGS

In describing the present invention, reference is made to the accompanying drawings wherein.

DESCRIPTION OF THE PREFERRED EMBODIMENTS

Figure 1:
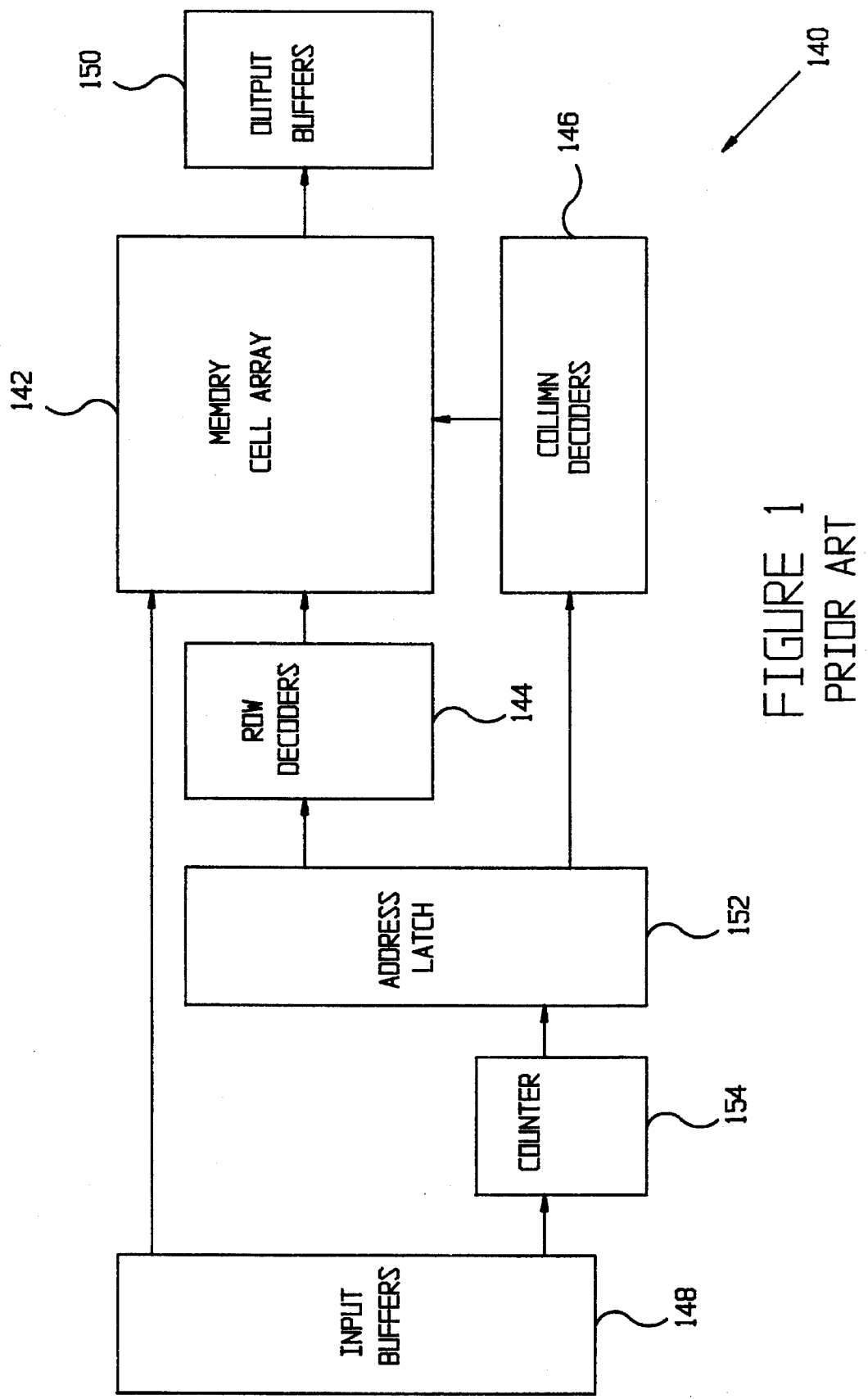
FIG. 1 is a block diagram illustrating a prior an memory circuit incorporating a counter for address generation.
Figure 2:
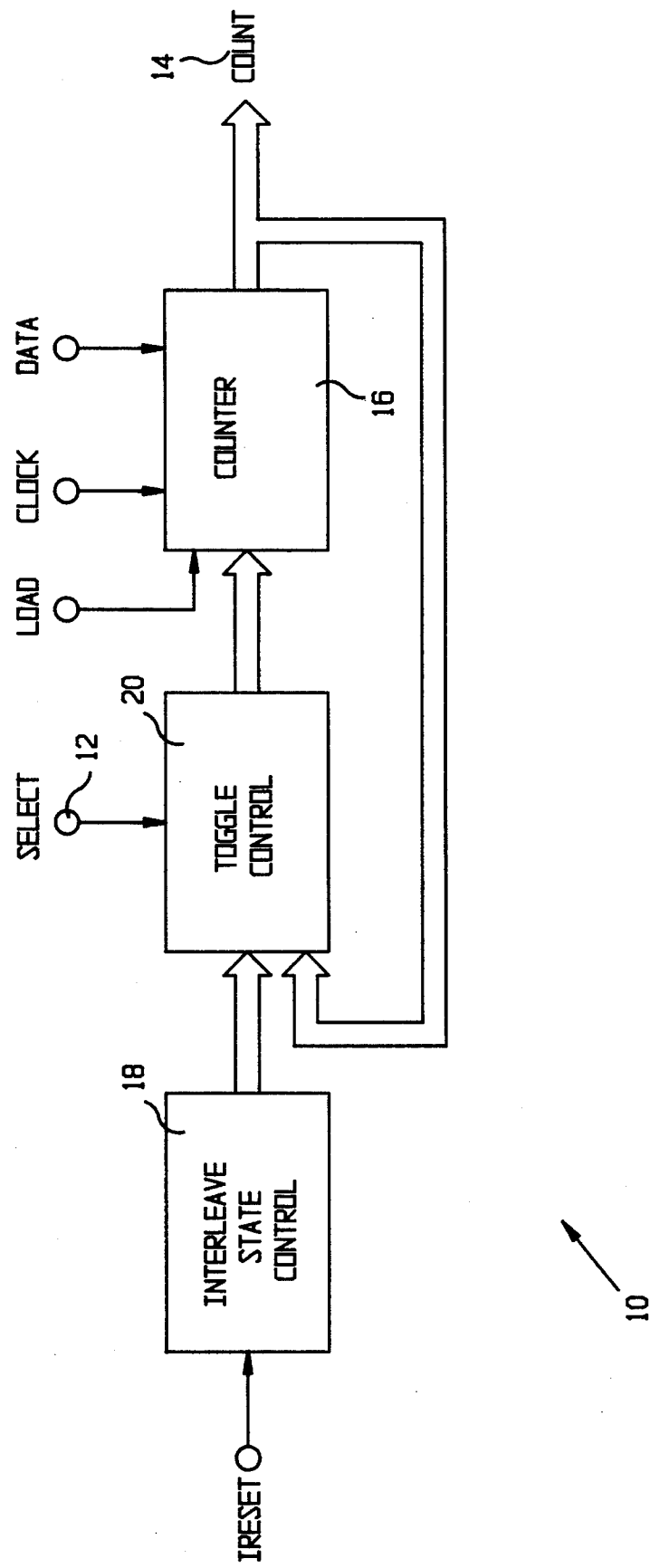
FIG. 2 is a block diagram illustrating an improved counter arrangement for a memory in accordance with the present invention.

FIG. 2 shows a block diagram of a preferred counter circuit 10 according to the present invention. Counter circuit 10 could be used in place of counter 154 of FIG. 1 to provide improved sequential address generation. Counter circuit 10 receives the following input signals: LOAD, CLOCK, DATA, SELECT, and IRESET. Circuit 10 provides a multiple bit count signal at an output 14 (on plural lines). The DATA signal provides the starting count. The LOAD signal is used to load the starting data, i.e. the starting count, into a counter 16 of circuit 10. The SELECT signal is used to select between the binary mode and the interleave mode (sometimes also called "scrambled" mode). The CLOCK signal is used to clock the counter 16. An IRESET input signal (interleave reset) is used to reset certain circuits, as described more fully below, and permits switching from binary mode to interleave mode without performing a new load function.

Counter 16 which receives the LOAD, CLOCK, and DATA signals and generates next count values in a binary or interleave progression as shown in Table 1. Counter 16 in the preferred embodiment includes a number of T flip-flops. In the preferred embodiment, the toggling of these flip-flops is controlled by toggle control circuit 20, which in turn is responsive to an interleave state control circuit 18 that keeps track of how many state transitions have occurred and provides toggle signals, when interleaving is enabled, to toggle control 20 and counter 16. Signals from counter 16 are supplied back to toggle control 20 and are used to determine toggle time for the counter when in binary mode. Interleave state control circuit 18 also provides a signal to the toggle control circuit 20 and determines when to toggle counter 16 when interleave mode is selected. Toggle control circuit 20 also receives the SELECT signal from the select input terminal 12. In response, toggle control 20 selectively controls toggle conditions for each counter stage of counter 16 which provides the appropriate count signal to the count output bus 14.

In this way, an improved counter circuit results. When used in conjunction with semiconductor memories, it can provide multiple address sequences for addressing memory data in blocks of sequential data without having to provide an address for each memory access.

THE SCHEMATIC BLOCK DIAGRAM

Figure 3:
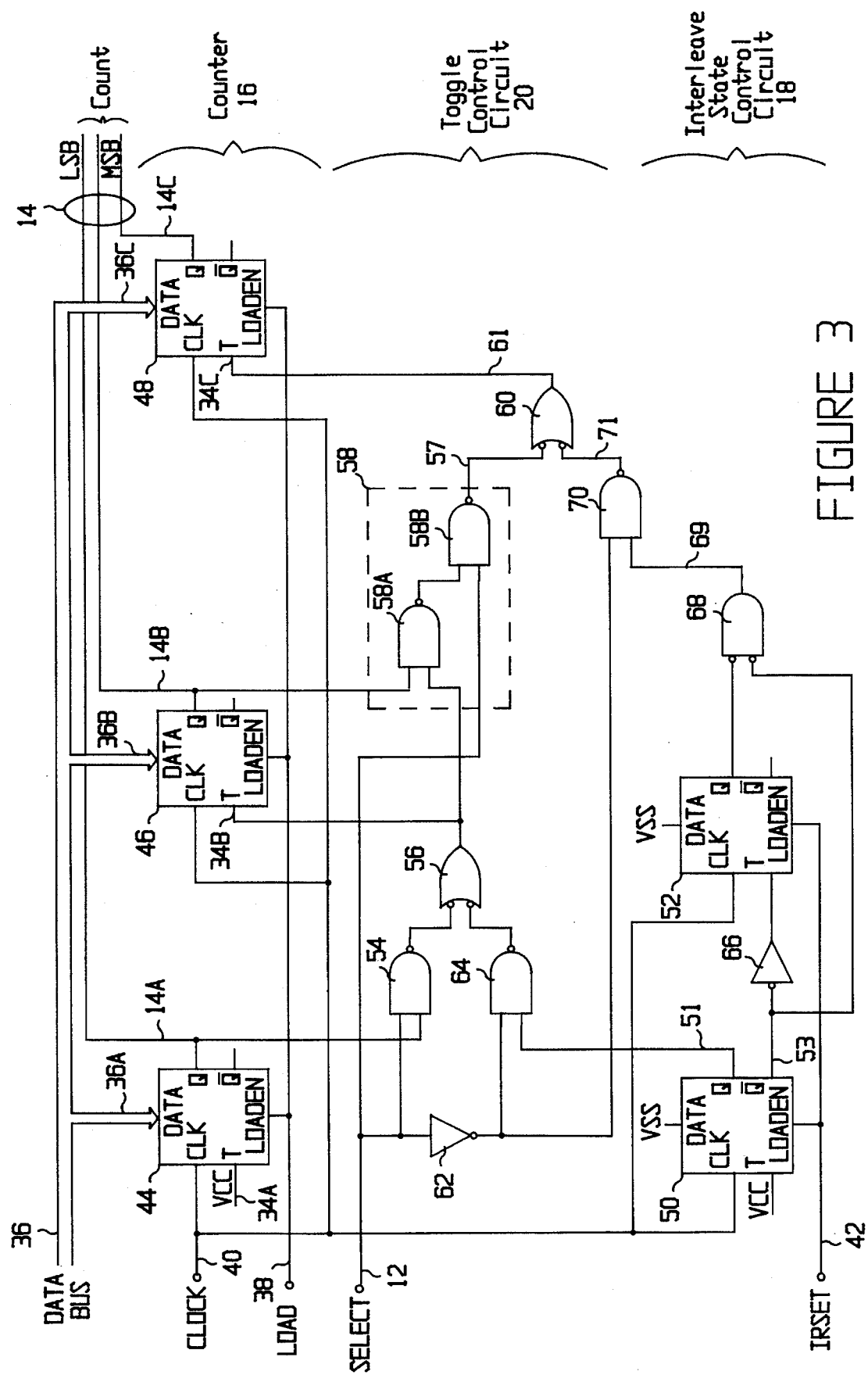
FIG. 3 is a more detailed schematic diagram illustrating an improved counter circuit in accordance with the present invention, that could be used for sequential memory address generation.

FIG. 3 shows more details of counter circuit 10 according to the present invention. Circuit 10 is preferably part of an integrated circuit, preferably a semiconductor memory device. Inputs to FIG. 3 are the data bus 36, the LOAD signal at input 38, the CLOCK signal at input 40, and the IRESET signal at input 42 (which optionally could be tied to input 38). The output of FIG. 3 is the count signal on the count bus 14.

Figure 4:
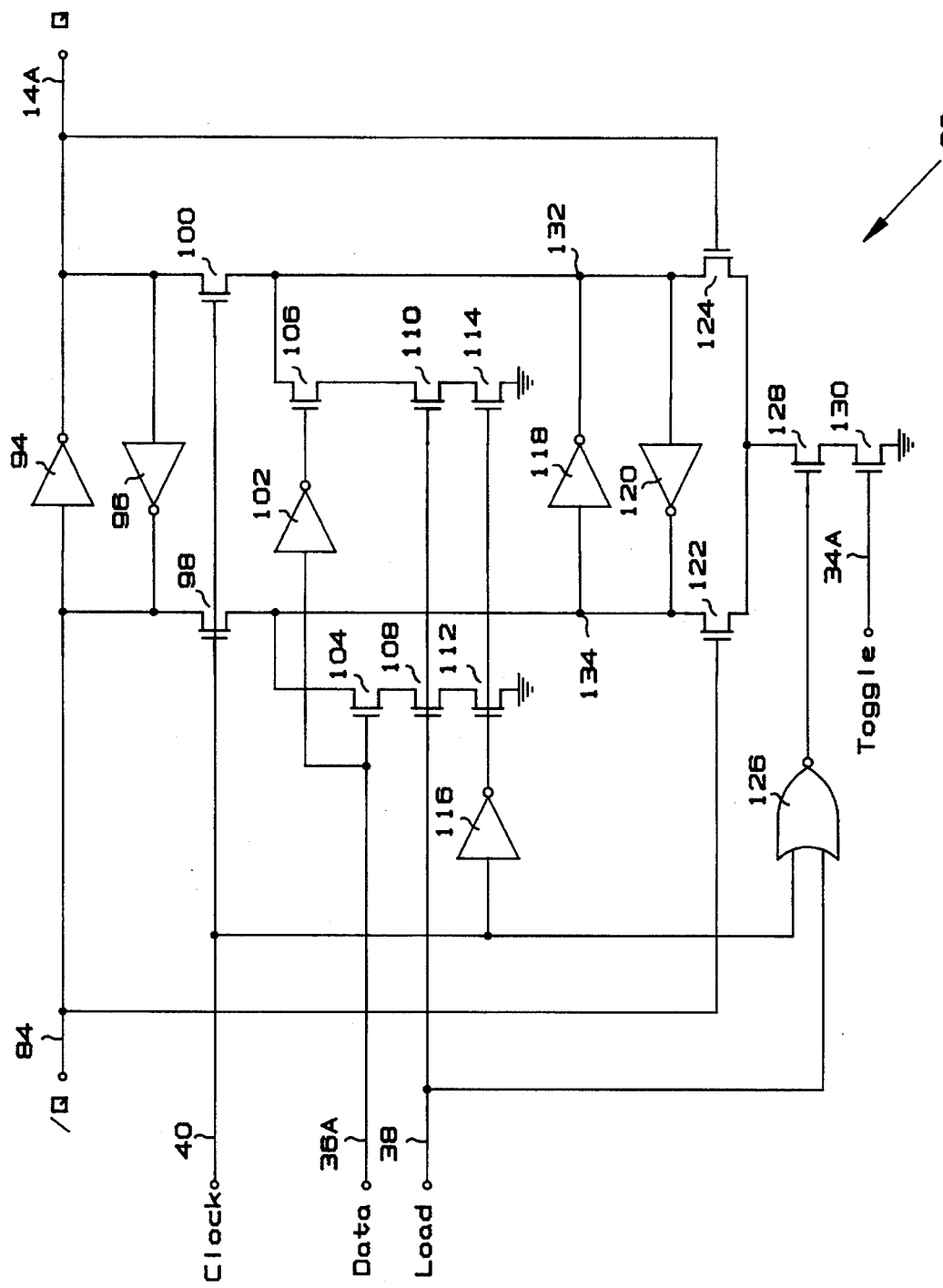
FIG. 4 is a description of the toggle flip-flop used in the schematic diagram of FIG. 3.

The preferred embodiment of counter circuit 10 contains five T-flip-flops 44, 46, 48, 50, and 52, of which the first three function as counter 16 and store the current count value. The last two function as the interleave control circuit 18. FIG. 4 will be described below but shows the circuit of a preferred T flip-flop.

Preferably the counter 16 comprises a group of counting stages. With reference to the counter 16 portion of FIG. 3, there are three such counting stages. T-flip-flop 44 is the lowest order counting stage and provides the first bit or least significant count bit. T-flip-flop 46 is the second lowest counting stage and provides the second count bit. T-flip-flop 48 is the third lowest counting stage (which in this illustrative embodiment is also the highest order stage) and provides the third count bit (in this case, the most significant bit). T-flip-flops 44, 46, and 48 receive as inputs the DATA signals on lines 36A, 36B, and 36C from data bus 36, the LOAD signal, and the CLOCK signal. The circuit cooperates with these signals for receiving a value from the data bus 36 to be stored in flip-flops 44, 46, and 48. The DATA signal bit at line 36A corresponds to flip-flop 44. The DATA signal bit at line 36B corresponds to flip-flop 46. Finally, the DATA signal bit at line 36C corresponds to flip-flop 48. The T-flip-flops 44, 46, and 48 additionally have toggle inputs coupled to nodes 34A, 34B, and 34C respectively. The toggle inputs operate in conjunction with the clock input 40, when the LOAD signal is inactive, to control when the flip-flop changes state (toggles). Finally, T-flip-flops 44, 46, and 48 output their current state (Q outputs) to count signal lines 14A, 14B, and 14C respectively of count bus 14. A more specific description of the data load and the state toggle will be discussed infra when the T-flip-flop is discussed in more detail in conjunction with FIG. 4.

The counter circuit 10 of FIG. 3 includes an implementation of toggle control circuit 20, one function of which is to produce control signals to generate a binary count sequence. (In other implementations binary control circuitry could be provided for this, but it is convenient here to include this function in circuit 20.) The control signals necessary for generating a binary progression, with the exception of the least significant bit, are such that a bit will change state or toggle only if all bits of lower significance are active when clocked. The least significant bit will always toggle when clocked.

The SELECT signal received at input 12 is connected to various logic circuitry which forms the toggle control circuit 20 (which selects the mode of counting). Such logic circuitry includes gates 54, 56, 58, 60, 62, 64, and 70. It may be noted that if the SELECT signal is high (binary count), then gates 54 and 58 are enabled, and binary counting ensues. However, if SELECT is low, then gates 64 and 70 are enabled via inverter 62, and gates 54 and 58 are disabled, so that toggling the higher order flip-flops 46 and 48 is controlled by the bottom flip-flops 50, 52.

The control signals used for preferred embodiment counter 16 when it is counting in binary form are as follows. It will be recalled that SELECT is high for this mode. T-flip-flop 44 will always toggle when clocked, so toggle input node 34A is always coupled to an active state, provided that binary mode is selected. Traditionally, this is a "high" state, connected to a power supply voltage such as VCC, as shown in FIG. 3. T-flip-flop 46 will toggle when clocked if the output of T-flip-flop 44 (the only bit of lower significance), which is the count signal outputted to line 14A, is active. Toggle input node 34B will be coupled via logic gates 54 and 56 to count signal 14A, when binary mode is selected. That is, if SELECT is high, then gate 54 is enabled and passes the count bit on line 14A to one input of gate 56, the output of which is connected to the toggle input T of flip-flop 46.

In the binary mode, T-flip-flop 48 will toggle when clocked if the outputs of flip-flops 44, 46 are active. Logic gate 58A has an input to receive the output signal from gate 56 and another input to receive the Q output signal from flip-flop 46. Thus, gate 58A receives the outputs of both flip-flops 44, 46 as inputs. When both inputs are high, the output of gate 58A will be high. This is applied to one input of a NAND gate 58B. The SELECT signal on line 12 is applied to another input of NAND gate 58B. Since SELECT is high during binary mode, the output of NAND gate 58B on a line 59 will be high when the Q outputs of both flip-flop 44 and flip-flop 46 are high. This is applied as one input to a logic gate 60, the output of which on a line 61 is a binary toggle control signal. Toggle input node 34C of flip-flop 46 is coupled to line 61 and receives the binary toggle control signal when binary mode is selected. Hence, each counter stage (each flip-flop) is toggled when its lower-order flip-flops have high Q outputs, and hence the counting (as controlled by inputted CLOCK pulses) is binary.

Counter circuit 10 of FIG. 3 contains interleave state control circuitry 18 for producing toggle control signals such that counter 16 generates an interleave count sequence when interleave mode ("Intel" or scrambled mode) is selected. This occurs when the SELECT signal is low. The conditions for generating an interleave progression are such that the (N)th bit will toggle on every $2^{N-1}$-th count. T-flip-flop 44, producing the first or least significant bit, will toggle every $2^0$ clock pulse, i.e., every clock pulse, because toggle input node 34A is coupled to an always active state, typically VCC. T-flip-flop 46, producing the second count bit, will toggle every $2^1$ or every other count starting on the second count when clocked. T-flip-flop 48, producing the third count bit, will toggle every 22 or every fourth count starting on the fourth count when clocked.

The FIG. 3 embodiment also includes interleave state control circuitry 18. This includes T-flip-flops 50 and 52 mentioned above. These are the same type as the T-flip-flops 44, 46 and 48 used in counter 16, and thus in the preferred embodiment their inputs are data, clock (CLK), toggle (T), and load enable (LOADEN); their outputs are Q and /Q. These flip-flops are configured to count in binary fashion in the preferred embodiment.

The data inputs of flip-flops 50 and 52 are connected to receive a "low" data state, so the data inputs are coupled to VSS. The load enable inputs are connected to a line 42 for receiving the signal IRESET in the preferred embodiment. (In another embodiment line 42 could be coupled to receive the LOAD signal received at input node 38. If a load cycle always starts a new address sequence, for either binary or interleave sequences, then the load control signal and the interleave control signal can be connected together and driven by the same control signal source.) The clock inputs for flip-flop 50, 52 are connected to node or line 40 which receives the CLOCK signal. The Clock signal must go low for either loading a new address in flip-flops 44, 46, and 48, or for resetting flip-flops 50 and 52, but the outputs of these flip-flops will not change until the clock goes high due to the master-slave flip-flop used. Whenever a new sequence is started, either by loading a new starting address into flip-flops 44, 46, and 48 or by using the value already contained in flip-flops 44, 46, and 48 as the new starting location, flip-flops 50 and 52 must be reset when counting in interleave mode. Flip-flops 50 and 52 do not have to be reset when in binary mode (or when switching from interleave mode to binary mode) except when flip-flops 50 and 52 are used for burst length indicators (explained later). When the signal IRESET on line 42 enters the active state (high), this signals T-flip-flops 50 and 52 to load whatever dam state is received at the data inputs (a low data state—VSS). IRESET pulses high when either a new address is loaded (the LOAD signal on line 38 goes high), or the mode switches to interleave (the SELECT signal at input 12 goes low).

T-flip-flops 50 and 52 effectively behave as state counters. T-flip-flop 50 is connected to toggle with each clock pulse. Thus, its toggle input is coupled to VCC or a "high" state. With IRESET line 42 low, each clock pulse on line 40 will change both the Q output 51 and the /Q output 53, resulting in a signal that is alternately high every other count cycle. In the preferred embodiment of FIG. 3, Q output 51 is the interleave toggle control signal for the second bit of the count signal. This interleave control signal is coupled through the logic of control circuit 20 to the toggle input 34B of flip-flop 46, when interleave mode is selected.

T-flip-flop 52 is configured to be toggled by an inverted /Q output signal from flip-flop 50. Thus, flip-flop 52 has its toggle input coupled to the output of an inverter 66 which has its input coupled to the complementary output /Q 53 of flip-flop 50. This will cause flip-flop 52 to toggle on every other clock pulse. Both outputs of T-flip-flop 52, Q and /Q, will alternately be high for two clock cycles and then will be low for two clock cycles. The outputs will continually repeat this pattern until a new address is loaded in response to the IRESET signal on line 42 going high. In the embodiment shown by FIG. 3, flip-flops 50 and 52 toggle independently of the SELECT input. For that reason, whenever the select mode is changed from binary to interleave and a new start address is being loaded into counter 16 (or the present address in counter 16 is being used as the new start address), an IRESET must be executed in order to synchronize the starting address being used in counter 16 with the interleave control counter 50 and 52. (An exception where IRESET does not have to occur is if all the previous count sequences were exactly 4 or 8 counts in length.) The easiest way to synchronize the loading of the starting address and resetting of the interleave control counter is to tie IRESET to LOAD where all new burst sequences must receive a simultaneous LOAD and IRESET signal.

A signal which is high every fourth count is generated by NOR'ing the complementary outputs of both T-flip-flops 50 and 52. A NOR gate 68 has its inputs coupled to the /Q outputs of both T-flip-flops 50 and 52. The output of NOR gate 68 is applied via line 69 to one input of a NAND gate 70 in the toggle control circuit 20 of FIG. 3. A second input of gate 70 is connected to receive the inverted SELECT signal via inverter 62, so that NAND gate 70 is enabled when SELECT is low (i.e., during the interleave mode). NAND gate 70 provides the interleave toggle control signal on line 71 for the third count bit of counter 16. This interleave toggle control signal is coupled via NOR gate 60 to the toggle input 34C of T-flip-flop 48, if interleave mode is selected.

By initially loading zeros in both T-flip-flops 50 and 52, the interleave control signal coupled to toggle input 34B will not signal the second bit of counter 16 (i.e. flip-flop 46) to begin toggling until the second count. Similarly, loading the zeros will guarantee the interleave control signal on line 69 coupled to toggle input 34C will not signal the third bit of counter 16 (i.e. flip-flop 48) to begin toggling until the fourth count. These two toggle start times are important for proper interleave counting.

The toggle control circuit 20 may be a standard 2-to-1 multiplexer. The toggle control circuit 20 selectively couples the binary toggle control signals (on lines 14A and 59) and the interleave toggle control signals (on lines 51 and 71) to the toggle inputs 34B, and 34C of counter 16. The binary toggle control signal for the least significant bit is the same as the interleave toggle control signal for the least significant bit. Both toggle control signals, for the least significant bit, are always coupled to VCC in the preferred embodiment. Because both signals are the same, there is no need to multiplex them. VCC may be coupled directly to toggle input 34A. However, the other two sets of toggle signals are not necessarily the same so they must be selectively coupled to their toggle control inputs 34B and 34C.

As noted above, the toggle control circuit 20 of FIG. 3 includes inverter 62 and six NAND gates 54, 56, 58B, 60, 64 and 70. It will be noted that gates 58A and 58B can be shown as a 3-input NAND gate. Moreover, some symbols in FIG. 3 show NOT-OR gates (e.g., gates 56, 60) which are equivalent in function to NAND gates. Either can be used. Inverter 62 has its input coupled to the SELECT signal on line 12 and generates the logical complement thereof. The NAND gates are divided into two groups of three. A first group consists of NAND gates 54, 56 and 64. A second group consists of NAND gates 58B, 60 and 70. Each group of three NAND gates selectively couples one of two control signals to a respective stage of counter 16.

The first group of NAND gates selects the second control signal which will toggle input 34B of T-flip-flop 46 of counter 16. NAND gate 54 has two inputs coupled to receive (a) the output of the lowest order flip-flop, i.e., flip-flop 44, on line 14A and (b) the SELECT signal on line 12. NAND gate 54 outputs the value of the binary control signal 14A in complementary form if the SELECT signal on line 12 is high, and this will be for counting in binary sequence. Thus, the signal on line 14A is not only the lowest order count output bit, but also a binary control signal (or precursor thereof). NAND gate 64 has two inputs coupled to receive (a) the interleave toggle control signal on line 51, which is the Q output of T-flip-flop 50, and (b) the inverted SELECT signal 12 via inverter 62. NAND gate 64 outputs the value of the interleave toggle control signal in complementary form if the SELECT signal on line 12 is low (i.e. interleave mode). Inputs to NAND gate 56 are the outputs of NAND gates 54 and 64. Gate 56 outputs the control signal selected in accordance with the SELECT signal. The output of NAND gate 56 is then coupled to toggle input node 34B, which in FIG. 3 is the second-lowest order counter stage.

The second group of NAND gates, i.e., gates 58B, 60 and 70, selectively couples the third toggle control signal from the second-lowest order counter stage 46 (used as a count output bit and as a binary control signal) and the interleave state control signal to toggle input 34C of T-flip-flop 48. Gate 58B provides a binary toggle control signal on line 59, and gate 70 provides an interleave toggle control signal on line 71. In the preferred embodiment, only one of these will be active (driven low) at a given time (since the SELECT signal is inputted without inversion to gate 58A but its complement is inputted to gate 70). That is, only one input to each of the two input NAND gates, 56 and 60, is allowed to go low (the other inputs, associated with the unselected mode, are forced high and have no influence on the outputs of 56 or 60).

Similar to the first group of NAND gates, NAND gate 58B has its two inputs coupled to receive (a) the output of AND gate 58A, and (b) the SELECT signal from input 12. It will be understood that AND gate 58A and NAND gate 58B may be combined to form a single 3input NAND gate. The NAND gate 70 has its inputs coupled to receive (a) the output of NAND gate 68, and (b) the inverted SELECT signal via inverter 62. The output of NAND gate 70 is the interleave toggle control signal on line 71. The interleave toggle control signal and the binary toggle control signal are coupled to two inputs of NAND gate 60. The output of NAND gate 60 is a counter toggle control signal on line 61 which is connected to the toggle input 34C of flip-flop 48. The counter toggle control signal is equivalent to the binary toggle control signal on line 59 if the SELECT signal at 12 is high (i.e. if binary mode is chosen). However, the counter toggle control signal on line 61 is equivalent to the interleave toggle control signal 69 if the SELECT signal is low (i.e. if interleave mode is chosen).

Therefore, toggle control circuit 20 selectively couples the binary and interleave toggle control signals to the toggle flip-flops in counter 16 based on the value of the SELECT signal received at input 12, thereby to operate the counter 16 so that it generates count sequences in either binary or interleave formats.

It is to be noted that circuit 10 provides address sequence generation in a non-pitch sensitive circuit. In other words, the circuit needs to be present only once in the semiconductor memory per device and does not need to be included inside the densely populated array of memory cells.

A PREFERRED T FLIP-FLOP

FIG. 4 shows a circuit 80, which is a more detailed schematic of the toggle flip-flop (T-flip-flop) used in the embodiment of the invention shown in FIG. 3. It will be appreciated that circuit 80 shows a master-slave T-flip-flop. Specifically, circuit 80 is a more detailed schematic of T-flip-flops 44, 46, 48, 50, and 52. For purposes of describing circuit 80, the description of the signals will be referenced with respect to T-flip-flop 44.

Inputs to circuit 80 comprise a toggle signal at input 34A, a data signal at input 36A, a LOAD signal at input 38, and a clock signal at input 40. Circuit 80 provides complementary outputs Q and /Q at output nodes 14A and 84. (In T-flip-flop 44 of FIG. 2, the /Q output is not used.)

In FIG. 4, an inverter 102 has an input coupled to data signal input 36A and outputs the complement of the data signal received at 36A. An inverter 116 has its input coupled to clock signal input 40 and outputs the complement of clock signal 40.

The signals Q and /Q at nodes 14A and 84 respectively are cross-coupled by two inverters 94 and 96 forming a latch. The output Q is driven by inverter 94. The output /Q is driven by inverter 96. The inverters are cross-coupled to insure a stable steady state output.

T-flip-flop contains two internal nodes 132 and 134. Like nodes 14A and 84, these are connected by two cross-coupled inverters 118 and 120 forming another latch.

Internal node 132 is selectively coupled to ground via two separate paths. The first path comprises the source-drain paths of n-channel transistors 106, 110, and 114 which are connected in series so that they all must be on to discharge node 132 to ground. The gate electrode of transistor 106 is connected to the output of inverter 102, which is inverts the data signal received at input 36A. The gate of transistor 110 is connected to the LOAD signal received at input 38. The gate signal of transistor 114 is connected to the output of inverter 116 which inverts the clock signal received at input 40. This first path from internal node 132 to ground is used to load a logic zero value to node 132 during a data load phase as described infra.

Internal node 134 is selectively coupled to ground via two separate paths. One path comprises the source-drain paths of three n-channel transistors 104, 108, and 112 which are connected in series such that they all must be on to discharge node 134 to ground. These transistors receive the very same control signals as transistors 106, 110, and 114, except that transistor 106 receives an inverted data signal but transistor 104 receives a non-inverted data signal. As a result, the data signal will determine which one of these paths to ground might be conductive at a given time, when other conditions are met. Hence, the gate of transistor 104 is coupled to receive the data signal from input 36A. The gate of transistor 108 is coupled to the LOAD signal from input 38. The gate of transistor 112 is coupled to the output of inverter 112 which complements (inverts) the clock signal from input 40. This path to ground from internal node 134 is used to load a logic zero value to node 134 during a data load phase, as described infra.

The second path to ground for internal node 132 is via the source-drain paths of three n-channel transistors 124, 128, and 130 which are arranged in series, so that all three transistors must be on to discharge node 132 to ground via this path. The gate electrode of transistor 124 is coupled to output signal Q provided at node 14A. The gate of transistor 128 is coupled to the output of a NOR gate 126. The inputs of NOR gate 126 are the LOAD signal from input 38 and the CLOCK signal from input 40. Therefore, transistor 128 turns on only when both the LOAD signal and the CLOCK signal are both low or inactive. The gate of transistor 130 is coupled to the toggle input 34A. This path to ground is used to load a "0" value to node 132 during a toggle phase if the Q signal at node 14A is high or active.

The second path to ground for internal node 134 comprises the source-drain paths of three, series-connected, n-channel pass transistors 122, 128, and 110. Transistors 128 and 130 have already been mentioned. Transistor 122 is arranged in series with transistors 128 and 130. Hence, all three transistors must be on to discharge node 134 to ground via this path. While this path to ground shares two pass transistors 128 and 130 with the previously described path for node 132, the third transistor 122 has its gate electrode coupled to the output signal/Q at node 84. This path to ground is used to load a logic zero value to node 134 during a toggle phase if the/Q signal at node 84 is high or active.

Finally, internal node 132 is selectively coupled to node 14A through n-channel transistor 100, and internal node 134 is selectively coupled to node 84 through n-channel transistor 98. The gates of both transistors 98 and 100 are coupled to receive the CLOCK signal from input 40 for synchronous loading of the values of internal nodes 132 and 134 to Q and/Q, respectively, when the CLOCK signal is high (active).

A data "0" is loaded into the T-flip-flop 80 as follows. During a load function, the ZLOAD signal (input 38) will be active. While the CLOCK signal (input 40) is low, nodes 14A and 84 are isolated via transistors 98 and 100 from internal nodes 132 and 134. If the data signal (input 36A) is low or inactive, it will be inverted by inverter 102 to turn on transistor 106. Conversely, the low data signal will cause transistor 104 to be turned off. Since this is a load function, the LOAD signal is high and thus transistors 108 and 110 turn on. With the CLOCK signal low, the output of inverter 116 is high and transistors 112, 114 also turn on. Hence, node 132 is coupled to ground via the source-drain paths of transistor 106, 110, and 114. Hence, a logic zero is "loaded" to node 132. With respect to node 134, recall that transistor 104 is off when the data input signal is low. Hence, node 134 finds no path to ground via series-connected transistors 104, 108, 112. Instead, internal node 134 will be brought to a logic high level (a "1") through inverter 120 inverting the logic low level at node 132. These logic levels at internal nodes 132 and 134 will be impressed on nodes 14A and 84 respectively when the CLOCK signal goes high to turn on transistors 98, 100. In this way, a data "0" is loaded into the T-flip-flop.

A data "1" is loaded into T-flip-flop 80 as follows. Again the LOAD signal will be active (high), so transistors 108 and 110 are on. While the CLOCK signal is low, transistors 112, 114 turn on, and if the data signal is high (active), then transistor 104 will be on and internal node 134 will be brought to ground (load a "0") via the source-drain paths of series connected transistors 104, 108, and 112. Internal node 132 will not be discharged to ground via its first path because the high data signal will be inverted by inverter 102 and thus transistor 106 will be turned off. Instead, node 132 will be brought high (become a "1") via the action of inverter 118 inverting the logic low signal that will have been loaded into node 134. The complementary data stored at internal nodes 132 and 134 will be loaded to nodes 14A and 84 respectively when the CLOCK signal goes high to turn on transistors 98, 100. In this way, a data "1" is loaded into T-flip-flop 80.

A description of how the T-flip-flop toggles is as follows. This involves the second paths to ground from internal nodes 132, 134. During a toggle function, the LOAD signal at input 38 will be low (thus turning off transistors 108, 110 and blocking the first paths to ground from nodes 132, 134). When the CLOCK signal at input 40 is also low, the output of NAND gate 126 is high, and transistor 126 turns on. When TOGGLE signal at input 34A is high, transistor 130 turns on. Either one (but not both) of the internal nodes 132, 134 will be coupled to ground depending on which output Q,/Q is high. Thus, if Q is high, then transistor 124 turns on, and node 132. Since Q and/Q are complementary, this means that transistor 122 will be off, so node 134 will have no path to ground. Conversely, internal node 134 will be coupled to ground if/Q is high, and node 132 will find no path to ground. The cross-coupling of inverters 118 and 120 forms a latch which will load a "1" onto the ungrounded node. Hence, the logic states change on internal nodes 132, 134, and the new states will be coupled to output nodes 14A and 84 respectively when the CLOCK signal at input 40 goes high and the internal nodes become coupled via transistors 98, 100 to the output nodes. This will cause the Q and/Q outputs to change states.

Whenever the TOGGLE signal at input 34A is low, neither of the internal nodes will be coupled to ground through these second paths, both of which include transistor 130. The T-flip-flop will not automatically change states, i.e. toggle.

Generally, toggle-flip-flop circuit 80 can perform two functions. The two functions are load and toggle. The load function allows an external value to be stored in the flip-flop. The toggle function allows the logic state stored in the flip-flop to change value. Toggling means that if the value stored in the flip-flop before the CLOCK pulse was a logic "0," then the value stored after the CLOCK pulse is a logic "1". Conversely, if the value stored in the flip-flop before the CLOCK pulse was a "1," then the state after the CLOCK pulse is a "0." The value stored in the flip-flop 80 corresponds to the value of output signal Q at node 14A. Data can be loaded into flip-flop 80 by placing the value to be loaded on dam input 36A and pulsing CLOCK signal at input 40 while the LOAD signal at input 38 is high. To toggle the value stored in the flip-flop, the LOAD signal at input 38 needs to be low, the toggle signal at input 34A needs to be high, and a CLOCK signal at input 40 needs to pulse.

While the counter circuit of the present invention features choosing between two modes of counting, binary and interleave, the circuit could easily be expanded to incorporate additional modes of counting. This could be accomplished by expanding the mode-select 20 circuit to multiplex between a greater number of counting circuits, and including additional counting circuits for generating the next count value in whatever new modes would be beneficial.

In actual practice, the SELECT and LOAD signals should be synchronized with the CLOCK signal. The timing relationships are straightforward and are not included here since the basic functionality of the disclosed device and its method of operation are clearly evident.

Hence, the disclosed apparatus and method provide programmable selection between the interleave sequence and the binary addressing sequence. Providing the address sequence via a counter allows address generation in a non-pitch sensitive circuit when used in synchronous DRAMs or other memory types that may require interleave/binary sequencing. The present circuit has been operated at 100 MHz, and permits on-the-fly (real time) switching between modes. The burst length for addresses in this embodiment is countable in binary fashion by flip-flops 50, 52, which provide an integral cycle counter. The interleave state control circuit 18 is actually a burst cycle counter. The counter 16 shown is capable of counting burst address sequences with burst lengths of up to 8 (8 distinct addresses based on 3 counter flip-flops), but the interleave control circuitry 18 can determine burst lengths of only 4 or less. An additional flip-flop must be added to the interleave state control circuitry 18 in order to extend the burst count detection capability to 8. (Standard burst lengths are 2, 4, and 8, but many limit to 4 based on microprocessor requirements.) The burst length is determined by the output states (binary count) of the interleave flip-flops (generally monitored during clock low time).

From the foregoing description, the construction and operation of the circuits according to the present invention should be evident. It may be noted that shifting modes on the fly is permitted with the disclosed embodiment. For example, if binary mode is chosen and the counter 16 counts up to a certain value (whether predetermined, preselected, or programmable) in binary progression, a change can be made to the interleave mode directly by simply changing the state of the SELECT signal. In most applications, the start of a new burst sequence is always accompanied by loading a new start address. In the case of binary counting, the interleave state control circuitry is not used to generate the address sequence. Therefore, if the burst sequence is binary, only a starting address needs to be loaded (the previous burst sequence could have been either binary or interleaved). However, in the case of interleaved counting, the interleave state control circuitry is used to generate the address sequence. Therefore, if the sequence is interleaved, then a new starting address and an IRESET must (or should usually) occur regardless if the previous burst sequence was binary or interleaved. However, IRESET would not have to be executed if the count addresses and the interleave state generator have remained synchronized.

Hence, if a new address burst is started, for either binary or interleaved bursts, a new address must be loaded via the LOAD signal. If binary count mode is to be used, IRESET does not have to be executed, but if interleaved count mode is used, IRESET must be executed. IRESET must be executed only when the interleaved state control circuitry is used to generate the address sequence (interleaved mode only), unless IRESET was synchronized with a starting address, and count addresses remained synchronized with state control 18.

The description has avoided detailed timing relationships of this counter. This implementation loads the start address during the low level of the CLOCK signal and increments to the next address on the rising edge of the CLOCK signal. This means that the first address is only half a cycle long, but all subsequent addresses are one full cycle in duration. This was intentional for the specific applications where this counter is used. In actual implementations, the first address is latched in a column address latch (see address latch 152 in FIG. 1) simultaneously while the counter is being loaded, but all of the following addresses are sourced from the counter and must be full cycle in duration. This mode of use is supported by the location of the counter as shown in FIG. 1. This makes it easy to start the addressing sequence and reduces the timing constraints of the counter. If a full cycle is needed for the counter, then the phasing of the load for the interleave state control circuitry must be shifted by 180 degrees in order to get a full starting address interval from the counter. Anyone familiar with logic would know how to get a full cycle during the load cycle.

While this invention has been described with reference to an illustrative embodiment, it will be understood that this description is not intended to be construed in a limiting sense, but is intended to include any substitutes within the scope of the invention. Various modifications of the illustrative embodiments, as well as other embodiments, will become apparent to those skilled in the art upon reference to this description. The invention is intended to be set forth in the following claims.

I claim:

1. A counter circuit for sequential address generation comprising:

a mode select input;

a toggle control circuit responsively coupled to said mode select input;

an interleave state control circuit coupled to said toggle control circuit;

a first counter responsively coupled to said toggle control circuit and providing a sequence of count values in a progression corresponding to a select signal applied to said mode select input;

wherein said toggle control circuit includes logic circuits and provides control signals to said counter based on the select signal;

wherein said interleave control circuit includes a second counter;

wherein said toggle control circuit is coupled to receive a lower order count signal for use in generating a binary sequence;

wherein said interleave state control circuit provides interleave control signals; and wherein said toggle control circuit selectively provides a signal corresponding to the lower order count signal or to the interleave control signal for use by the first counter.

2. The counter circuit of claim 1 wherein said first counter comprises a plurality of toggle flip-flops each providing a respective count bit to a count output, each toggle flip-flop having a respective toggle input; and wherein said toggle control circuit provides control signals for at least one of said toggle flip-flops.

3. The counter circuit of claim 2 wherein said toggle flip-flops include data inputs for receiving starting count data, load enable inputs for controlling the loading of said data, and clock inputs for receiving a clock signal.

4. The counter circuit of claim 3 wherein said second counter comprises first and second toggle flip-flops, said second toggle flip-flop being responsively coupled to said first toggle flip-flop;

wherein said first and second toggle flip-flops are coupled to said toggle control circuit to provide toggle signals thereto;

said interleave control circuit further including an interleave reset input coupled to said first and second toggle flip-flops.

5. A programmable counter circuit for sequential address generation comprising:

a plurality of controllable counting stages providing output bits to a count output, the counting stages having orders of significance from a lowest order to a highest order;

an interleave control circuit configured to provide interleave signals for counting in an interleave sequence;

a select input to receive a select signal;

a first control circuit coupled to said select input and responsive to said select signal to select between control signals for binary counting or interleave counting, the first control circuit being controllingly coupled to an input of at least one of the higher order counting stages, the first control circuit being coupled to receive an output of at least one of the lower order counting stages and coupled to receive said interleave signals; and wherein said first control circuit controls at least one of said counting stages to count values in a binary progression or an interleave progression depending on the state of the select signal.

6. The counter circuit according to claim 5 wherein said counter circuit further comprises a data input for setting a count value.

7. The counter circuit according to claim 5 wherein said counting stages include a plurality of latches.

8. The counter circuit according to claim 7 wherein each said counting stage comprises a toggle flip-flop; and wherein both said first control circuit and interleave control circuit are configured to provide toggle control signals which are coupled to said toggle flip-flops.

9. The counter circuit according to claim 5 wherein said interleave control circuit includes an interleave reset input.

10. The counter circuit according to claim 5 wherein said first control circuit includes a mode-select circuit comprising a multiplexer circuit.

11. The counter circuit according to claim 5 wherein two of said count output bits are coupled to said first control circuit for providing binary count control signals.

12. A counter circuit according to claim 7 wherein said counter circuit is used in semiconductor memory devices to generate a stream of addresses in one of a binary count progression and an interleave count progression;

wherein multiple data accesses may be made with a single address load for multiple memory accesses.

13. A method for selectively generating a binary count sequence or an interleave count sequence comprising the steps of: receiving a select input and selecting one of a binary count sequence and an interleave count sequence based on the state of the select input; operating count stages to generate counts in the selected sequence;

controlling said count stages using at least one lower order count stage output for providing a control signal for a higher order count stage when the binary count sequence is selected; and controlling the count stages using another source of control signals for the count stages when the interleave count sequence is selected.

14. The method according to claim 13 wherein the step of controlling the count stages in the interleave sequence includes generating a further count sequence for use as control signals for the count stages.

15. The method of claim 14 wherein said further count sequence is a binary sequence.

16. The method according to claim 13 wherein the method for generating includes receiving the initial count value from a data input and loading the initial count value into said count stages.

17. A method of generating a programmable binary/interleave address sequence for a semiconductor memory device comprising the steps of:

receiving an initial address value;

receiving a select input;

selecting one of a binary count sequence and an interleave count sequence based on the state of the select input;

generating counts in the selected sequence, including toggling a lowest order count stage to provide a lowest order bit, then generating a second lowest order bit by selectively using the lowest order bit or an interleave toggle control signal, for toggling the second lowest order count stage, then generating a third lowest order bit by selectively using a logical combination of said lowest order bit and the second lowest order bit, or an interleave toggle control signal, for toggling the third lowest order count stage.

18. The method of claim 17 wherein said method includes using further count stages for internally generating the interleave toggle control signals.

19. The method of claim 18 wherein said step of using further count stages includes resetting the further count stages in response to an interleave reset signal.

20. The method of claim 18 wherein said steps of selectively using include selectively passing either said binary toggle control signals or said interleave toggle control signals to toggle the count stages.

21. The method of claim 18 wherein said internally generating step comprises internally generating a binary sequence.

\* \* \* \* \*

UNITED STATES PATENT AND TRADEMARK OFFICE
CERTIFICATE OF CORRECTION

PATENT NO. : 5,481,581
DATED : January 2, 1996
INVENTOR(S) : Oscar F. JONES, Jr.

It is certified that error appears in the above-identified patent and that said Letters Patent is hereby corrected as shown below:

Title page, item [19], change "Jonas, Jr." to --Jones, Jr.--;

Title page, item [75], after Oscar F., change "Jonas, Jr." to --Jones, Jr.--.

Signed and Sealed this

Twenty-fourth Day of November, 1998

Attest:

BRUCE LEHMAN

*Attesting Officer*  *Commissioner of Patents and Trademarks*

UNITED STATES PATENT AND TRADEMARK OFFICE
CERTIFICATE OF CORRECTION

PATENT NO. : 5,481,581
DATED : January 2, 1996
INVENTOR(S) : Oscar F. Jones, Jr.

It is certified that error appears in the above-identified patent and that said Letters Patent is hereby corrected as shown below:

Delete Figure 3 and substitute therefor the following:

Signed and Sealed this

First Day of February, 2000

Attest:

Q. TODD DICKINSON

*Attesting Officer*    *Acting Commissioner of Patents and Trademarks*

UNITED STATES PATENT AND TRADEMARK OFFICE
CERTIFICATE OF CORRECTION

PATENT NO. : 5,481,581         Page 2 of 2
DATED      : January 2, 1996
INVENTOR(S): Oscar F. JONES, Jr.

It is certified that error appears in the above-indentified patent and that said Letters Patent is hereby corrected as shown below:

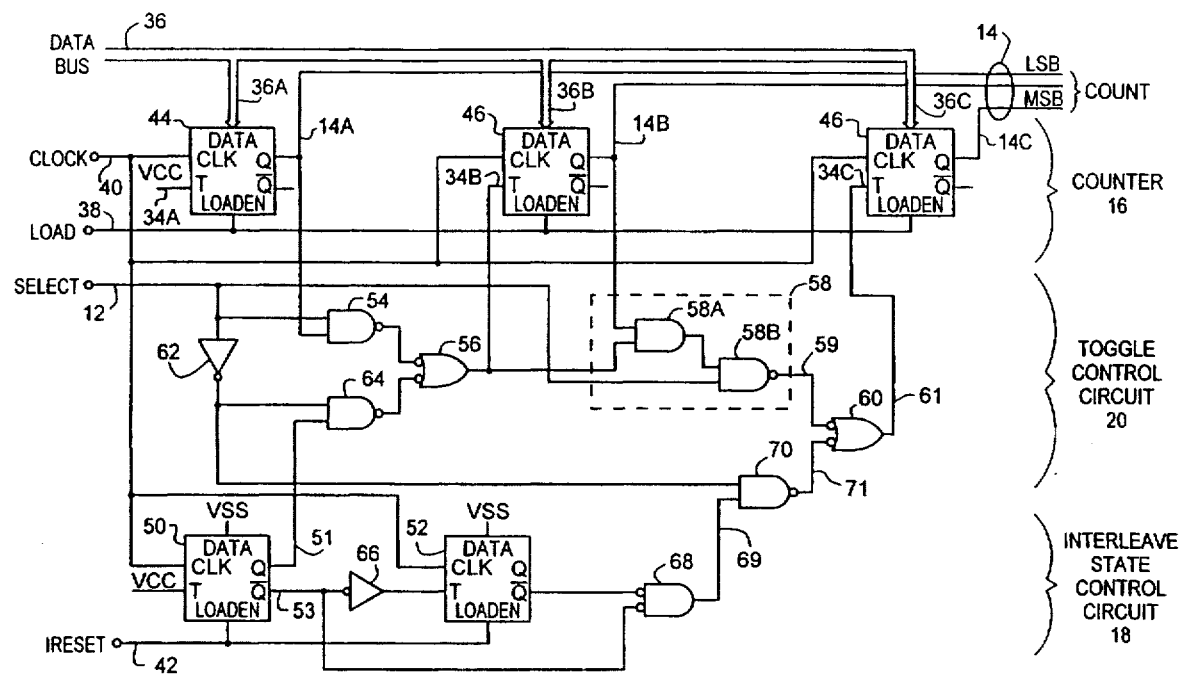

FIGURE 3